(12) United States Patent
Mo et al.

(10) Patent No.: US 8,198,809 B2
(45) Date of Patent: Jun. 12, 2012

(54) ORGANIC ELECTROLUMINESCENCE DEVICE AND ELECTRONIC DEVICE HAVING THE SAME

(75) Inventors: Yao-An Mo, Tainan (TW);
Chung-Chun Lee, Yunlin County (TW)

(73) Assignee: Au Optronics Corporation, Hsinchu (TW)

( * ) Notice: Subject to any disclaimer, the term of this patent is extended or adjusted under 35 U.S.C. 154(b) by 81 days.

(21) Appl. No.: 12/778,102

(22) Filed: May 11, 2010

(65) Prior Publication Data

US 2011/0089819 A1    Apr. 21, 2011

(30) Foreign Application Priority Data

Oct. 21, 2009    (TW) .............................. 98135644 A

(51) Int. Cl.
*H01J 1/62*    (2006.01)
(52) U.S. Cl. ....................................................... 313/512
(58) Field of Classification Search ........... 313/504–512
See application file for complete search history.

(56) References Cited

U.S. PATENT DOCUMENTS

| | | | |
|---|---|---|---|
| 5,747,363 A * | 5/1998 | Wei et al. ........................... | 438/5 |
| 6,727,519 B1 * | 4/2004 | Wu ................................. | 257/81 |
| 6,867,539 B1 | 3/2005 | McCormick et al. | |
| 7,105,999 B2 * | 9/2006 | Park et al. ..................... | 313/505 |
| 7,253,087 B2 | 8/2007 | Utsunomiya | |
| 2008/0231180 A1 * | 9/2008 | Waffenschmidt et al. .... | 313/506 |

FOREIGN PATENT DOCUMENTS

| | | |
|---|---|---|
| CN | 101228649 | 7/2008 |
| JP | 2008226598 | 9/2008 |
| TW | 586096 | 5/2004 |

OTHER PUBLICATIONS

"First Office Action of China Counterpart Application," issued on Sep. 19, 2010, p. 1-p. 5, in which the listed reference was cited.

* cited by examiner

*Primary Examiner* — Peter Macchiarolo
(74) *Attorney, Agent, or Firm* — Jianq Chyun IP Office

(57) ABSTRACT

An organic electroluminescence device including a substrate, an organic emitting device layer, a circuit board, a sealant and an electrical bonding layer is provided. The organic emitting device layer is on the substrate and has a first electrode layer, an emitting layer and a second electrode layer. The first electrode layer is disposed on the substrate, the emitting layer is disposed on the first electrode layer and the second electrode layer is disposed on the emitting layer. The circuit board is disposed over the substrate and covers the organic emitting device layer. The sealant is disposed between the substrate and the circuit board to seal the circuit board on the substrate. The electrical bonding layer is disposed between the substrate and the circuit board to electrically connect the circuit board and the first electrode layer of the organic emitting device layer.

24 Claims, 6 Drawing Sheets

ORGANIC ELECTROLUMINESCENCE DEVICE AND ELECTRONIC DEVICE HAVING THE SAME

CROSS-REFERENCE TO RELATED APPLICATION

This application claims the priority benefit of Taiwan application serial no. 98135644, filed on Oct. 21, 2009. The entirety of the above-mentioned patent application is hereby incorporated by reference herein and made a part of specification.

BACKGROUND OF THE INVENTION

1. Field of the Invention

The present invention is related to a luminescence device and more particularly to an organic electroluminescence device and an electronic apparatus having the organic electroluminescence device.

2. Description of Related Art

The organic electroluminescence display is a self-emissive display. The organic electro-luminescent displays have the advantages of no viewing angle restriction, high response speed (about hundred times of the response speed of the liquid crystal display), low power consumption, direct current driving function applicable to portable device, lightness and small dimension varying with the hardware. Therefore, the organic electroluminescent device has great potential for development, and is expected to be the new flat panel display of the next-generation.

The organic electroluminescence display is composed of an upper electrode layer, a lower electrode layer and an organic light emitting layer disposed between the upper electrode layer and the lower electrode layer. Generally, the lower electrode layer is made of transparent conductive material so that the light generated by the organic light emitting layer can transmit out of the lower electrode layer. However, the resistance of the transparent conductive material is higher than the resistance of the metal material. Thus, when the organic electroluminescence displays are developed to have larger sizes and the power inputs into the organic electroluminescence display along a single direction, the resistance of the lower electrode layer is so high that the voltage drop difference between the region close to the power source end and the region away from the power source end becomes obvious. Thus, the light emitting uniformity of the display is poor.

Moreover, in order to block the external moisture and oxygen from entering the organic light emitting layer of the organic electroluminescence display, a glass cover plate is used to cover and seal the organic light emitting layer within the organic electroluminescence display. In other words, the glass cover plate is additionally applied on the conventional organic electroluminescence display so that the cost of the glass cover plate and the time for assembling the glass cover plate are increased.

SUMMARY OF THE INVENTION

The present invention provides an organic electroluminescence device and an electronic apparatus having the organic electroluminescence device without using any glass cover plate.

Moreover, present invention provides an organic electroluminescence device and an electronic apparatus having the organic electroluminescence device capable of solving the problem of the voltage drop difference between the region close to the power source end and the region away from the power source end.

The present invention provides the organic electroluminescence device including a substrate, an organic emitting device layer, a circuit board, a sealant and an electrical bonding layer. The organic emitting device layer is disposed on the substrate, wherein the organic emitting device layer includes a first electrode layer, an emitting layer and a second electrode layer, and the first electrode layer is disposed on the substrate, the emitting layer is disposed on the first electrode layer and the second electrode layer is disposed on the emitting layer. The circuit board is disposed over the substrate and covers the organic emitting device layer. The sealant is disposed between the substrate and the circuit board to seal the circuit board on the substrate. The electrical bonding layer is disposed between the substrate and the circuit board to electrically connect the circuit board and the first electrode layer of the organic emitting device layer.

The invention provides an electronic apparatus including an organic electroluminescence device and a driving device. The organic electroluminescence device includes a substrate, an organic emitting device layer, a circuit board, a sealant and an electrical bonding layer. The organic emitting device layer is disposed on the substrate, wherein the organic emitting device layer includes a first electrode layer, an emitting layer and a second electrode layer, and the first electrode layer is disposed on the substrate, the emitting layer is disposed on the first electrode layer and the second electrode layer is disposed on the emitting layer. The circuit board is disposed over the substrate and covers the organic emitting device layer. The sealant is disposed between the substrate and the circuit board to seal the circuit board on the substrate. The electrical bonding layer is disposed between the substrate and the circuit board to electrically connect the circuit board and the first electrode layer of the organic emitting device layer. The driving device is electrically connected to the circuit board of the organic electroluminescence device.

In the organic electroluminescence device of the present invention, the circuit board is directly disposed on the organic emitting device layer to protect the organic emitting device layer so that the circuit board can replace the conventional glass cover plate to save the cost of the glass cover plate and the time for assembling the glass cover plate. Moreover, the circuit board disposed over the substrate is electrically connected to the first electrode layer of the organic emitting device layer so that the current signal on the circuit board can be transmitted to the first electrode layer. Thus, the problem of the voltage drop difference between the region close to the power source end and the region away from the power source end due to the single power input direction of the conventional organic electroluminescence device can be solved.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
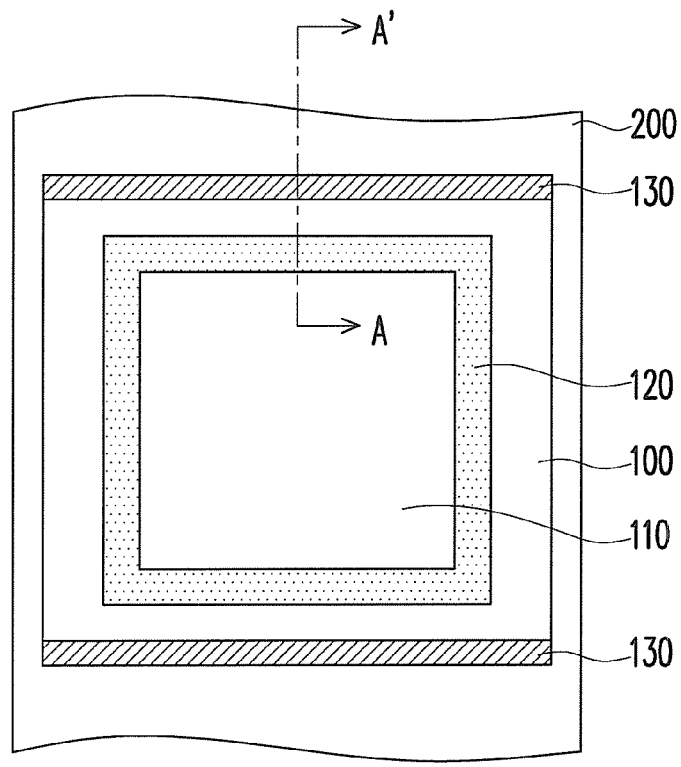
FIG. 1 is a schematic top view of an organic electroluminescence device according to one embodiment of the invention.
Figure 2:
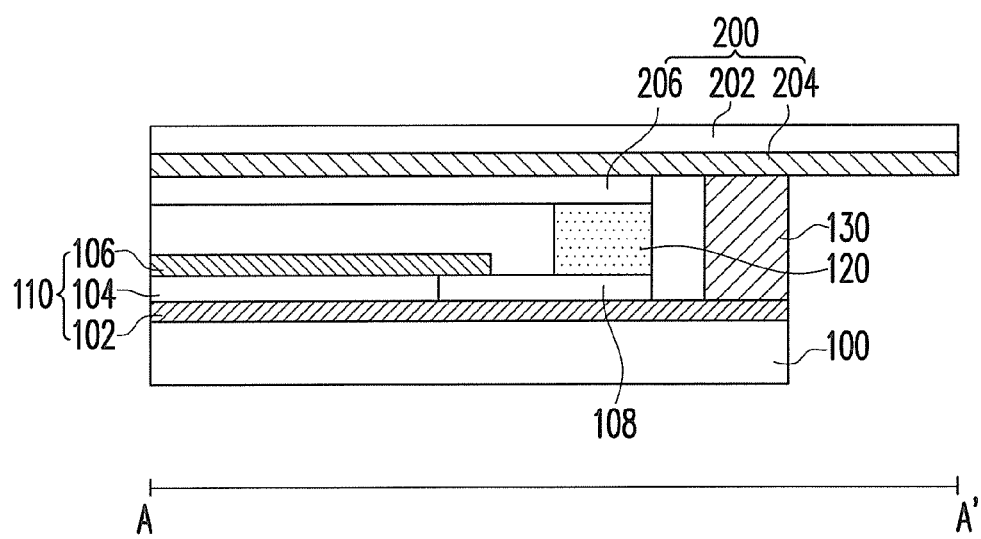
FIG. 2 is a cross-sectional view along A-A' in FIG. 1.

FIG. 1 is a schematic top view of an organic electroluminescence device according to one embodiment of the invention. FIG. 2 is a cross-sectional view along A-A' in FIG. 1. As shown in FIG. 1 together with FIG. 2, the organic electroluminescence device of the present embodiment includes a substrate 100, an organic emitting device layer 110, a circuit board 200, a sealant 120 and an electrical bonding layer 130.

The substrate 100 can be a transparent substrate such as a transparent glass substrate or a transparent flexible substrate. The substrate 100 is mainly used to carry devices composed of the organic electroluminescence devices. In order to transmit the light generated by the organic electroluminescence device out of the substrate 100, the substrate 100 is made of the transparent material or the light transmission material. Generally, the organic electroluminescence device having the light transmitting out of the substrate 100 is also named as bottom emission organic electroluminescence device.

The organic emitting device layer 110 is disposed on the substrate 100. Particularly, the organic emitting device layer 100 includes a first electrode layer 102, an emitting layer 104 and a second electrode layer 106. The first electrode layer 102 is disposed on the substrate 100, the emitting layer 104 is disposed on the first electrode layer 102 and the second electrode layer 106 is disposed on the emitting layer 104. The first electrode layer 102 can be a transparent electrode layer and can be, for example, made of indium tin oxide (ITO) or indium zinc oxide (IZO). The emitting layer 104 can be, for example, an organic emitting layer including a red organic emitting pattern, a green organic emitting pattern and a blue organic emitting pattern, or the other emitting patterns with different colors (such as white, orange, purple, etc.) generated by combining various light spectrums. The second electrode layer 106 can be a metal electrode layer. According to other embodiments, the organic emitting device layer 110 further comprises an electron injecting layer, a hole injecting layer, an electron transporting layer and a hole transporting layer. Moreover, according to the embodiments of the present invention, a patterned insulating layer 108 further covers the first electrode layer 102 to define several unit regions, and the emitting layer 104 is formed within the unit regions defined by the patterned insulating layer 108.

The organic emitting device layer 110 can be, for example, a passive organic emitting device layer or an active organic emitting device layer. If the organic emitting device layer 110 is a passive organic emitting device layer, the first electrode layer 102 and the second electrode layer 106 are respectively composed of several stripe electrode patterns. Further, the electrode pattern of the first electrode layer 102 and the electrode pattern of the second electrode layer 106 are arranged to cross over each other to form several pixel units.

Figure 3:
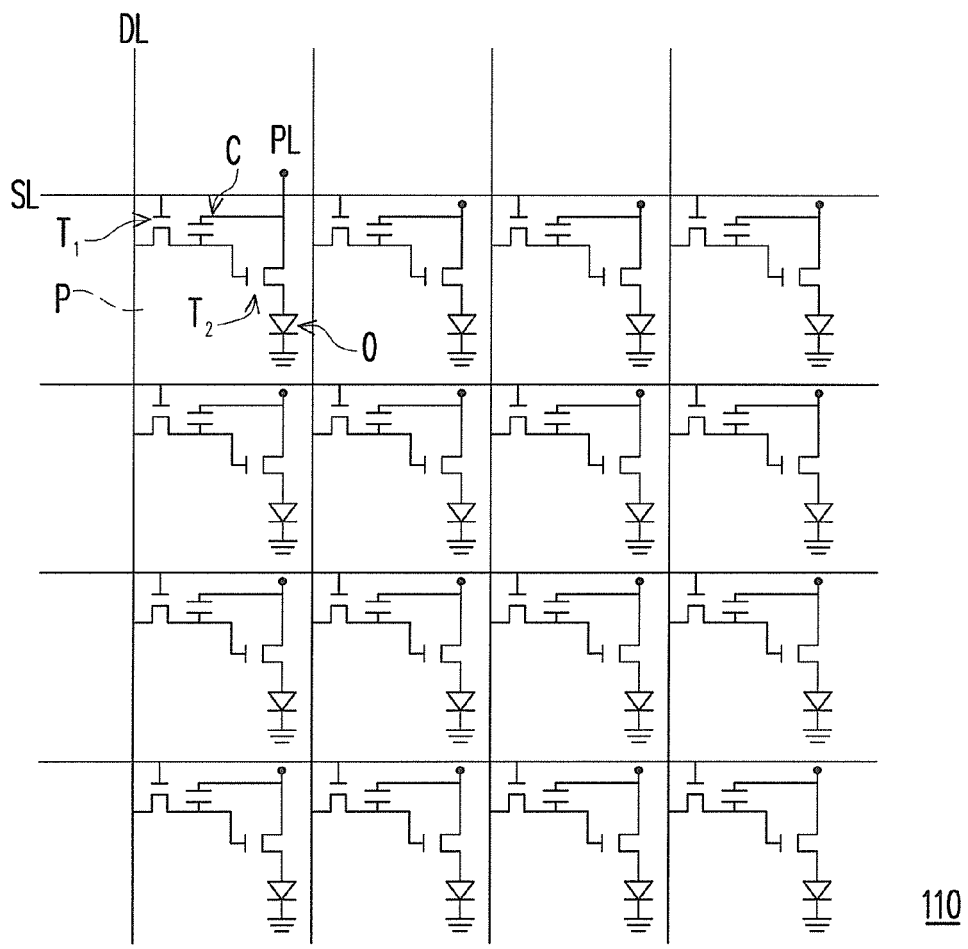
FIG. 3 is an equivalent circuit diagram of an active organic emitting device layer according to one embodiment of the invention.

If the organic emitting device layer 110 is an active organic emitting device layer, the organic emitting device layer 110 is composed of several data lines DL, several scan lines SL, several power lines PL and several pixel units P, as shown in FIG. 3. Each pixel unit P is electrically connected to one of the data lines DL, one of the scan lines SL and one of the power lines PL. Each pixel unit P comprises at least a thin film transistor T1, a thin film transistor T2, a capacitor C and an organic light emitting diode O. In the present embodiment, the pixel unit P composed of two thin film transistors and one capacitor (2T1C) is taken as an example in the description and the present invention is not limited to the structure mentioned above. That is, the number of the thin film transistors and the number of the capacitors in each of the pixel units P of the present invention are not limited. In the 2T1C type pixel unit P, the source of the thin film transistor T1 is connected to the data line DL, and the gate of the thin film transistor T1 is electrically connected to the scan line SL, and the drain of the thin film transistor T1 is connected to the gate of the thin film transistor T2. Further, the gate of the thin film transistor T2 is connected to the drain of the thin film transistor T1, and the source of the thin film transistor T2 is electrically connected to the power line PL, and the drain of the thin film transistor T2 is electrically connected to the organic light emitting diode O. One terminal of the capacitor C is electrically connected to the drain of the thin film transistor T1 and the gate of the thin film transistor T2. Furthermore, the other terminal of the capacitor C is electrically connected to the source of the thin film transistor T2 and the power line PL. The active organic emitting device layer 110 shown in FIG. 3 is only used to explain the structure of the organic emitting device layer such that people skilled in the art can understand and further implement the present invention. However, the present invention is not limited by the structure of the organic emitting device layer shown in FIG. 3. That is, the layout designs of other active organic emitting device layers can be also applied in other embodiments of the present invention.

As shown in FIG. 1 and FIG. 2, the circuit board 200 is disposed over the substrate 100 and covers the organic emitting device layer 110. In the present embodiment, the circuit board 200 comprises a substrate 202, a conductive line layer 204 and a cover layer 206. The conductive line layer 204 is disposed between the substrate 202 and the cover layer 206. The circuit board 200 can be a flexible circuit board such as a flexible printed circuit board (FPC).

The sealant 120 is disposed between the substrate 100 and the circuit board 200 to adhere the circuit board 200 on the substrate 100. The sealant 120 can be a photo curing sealant material or a thermal curing sealant material. In the present embodiment, in order to tightly adhere the circuit board 200 on the substrate 100 to block the external moisture and oxygen from entering the organic emitting device layer 110, the sealant 120 is preferably disposed to surround the organic emitting device layer 110. However, the present invention is not limited by the aforementioned configuration. In other embodiments, if other moisture-and-oxygen-proof designs are applied around the organic emitting device layer 110, the sealant 120 can be disposed on one, two or three sides of the organic emitting device layer 110 as long as the circuit board 200 is adhered on the substrate 100.

The electrical bonding layer 130 is disposed between the substrate 100 and the circuit board 200 to electrically connect the conductive line layer 204 of the circuit board 200 and the first electrode layer 102 of the organic emitting device layer 110. More particularly, the first electrode layer 102 of the organic emitting device layer 110 extends to the outer peripheral region of the sealant 120, and the extended portion of first electrode layer 102 over the outer peripheral region of the sealant 120 is not covered by any film layers. A portion of the conductive line layer 204 in a region of the circuit board 200 corresponding to the extended portion of the first electrode layer 102 at the outer peripheral region of the sealant 120 is exposed. That is, the conductive line layer 204 in this region is not covered by the cover layer 206. Hence, the electrical bonding layer 130 is formed between the extended first electrode layer 102 at the outer peripheral region of the sealant 120 and the exposed portion of the conductive line layer 204 so that the conductive line layer 204 of the circuit board 200 can electrically connected to the first electrode layer 102 of the organic emitting device layer 110. In the present embodiment, the electrical bonding layer 130 can be, for example, an anisotropic conductive paste layer. Nevertheless, other types of electrical bonding materials can also be used in other embodiments.

Further, as shown in FIG. 1, in the present embodiment, the aforementioned electrical bonding layer 130 is disposed at two opposite sides of the organic emitting device layer 110. Therefore, the current signal on the circuit board 200 can be transmitted into the organic emitting device layer 110 through both sides of the organic emitting device layer 110. Thus, the signal transmission method can alleviate the obvious voltage drop phenomenon of the organic emitting device layer 110 caused by the single input direction of the current signal. Therefore, the problem of poor light emitting uniformity due to the obvious voltage drop difference can be solved.

Moreover, in the configuration that the circuit board 200 covers the organic emitting device layer 110, not only the current signal on the circuit board 200 can be transmitted into the organic emitting device layer 110 through both sides of the organic emitting device layer 110 but also the circuit board 200 can be used as a cover layer for protecting the organic emitting device layer 110 from being scratched or damaged.

Figure 4:
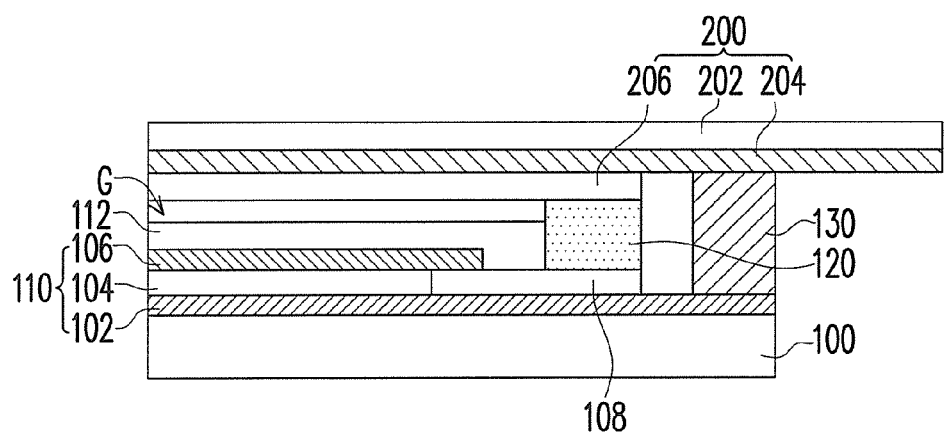
FIGS. 4 through FIG. 6 are schematic cross-sectional views showing organic electroluminescence devices according to some embodiments of the invention.

FIG. 4 is schematic cross-sectional view showing an organic electroluminescence device according to another embodiment of the invention. The embodiment shown in FIG. 4 is similar to the embodiment shown in FIG. 1 so that components identical to those of FIG. 1 will be denoted with the same numerals in FIG. 4 and not repeated herein. The difference between the embodiment shown in FIG. 4 and the embodiment shown in FIG. 1 is that the organic electroluminescence device of FIG. 4 further comprises a passivation layer 112 covering the organic emitting device layer 110 for blocking the external moisture and oxygen from entering the organic emitting device layer 110. The passivation layer 112 can be made from inorganic material or organic material by, for example, deposition or coating on the surface of the organic emitting device layer 110.

Figure 5:
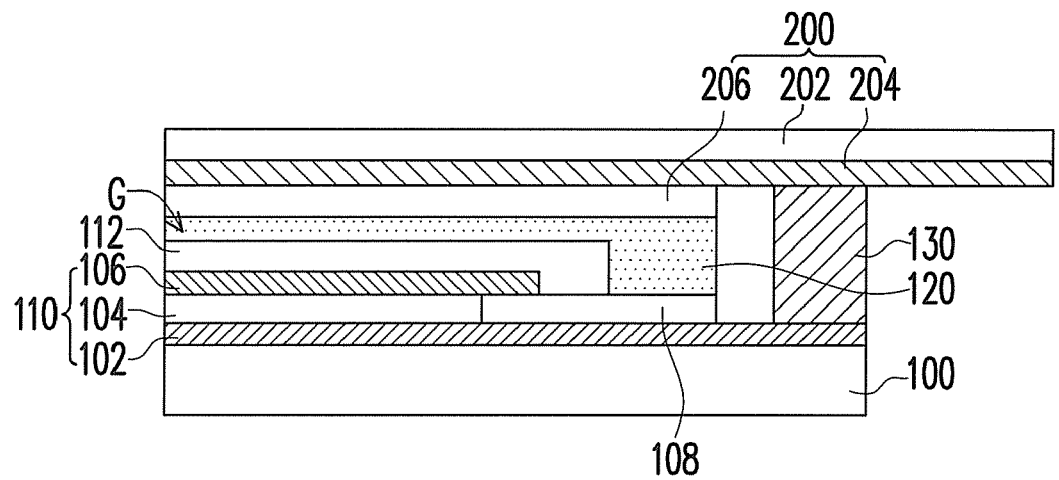

In the embodiment shown in FIG. 4, there is a gap G between the passivation layer 112 and the circuit board 200. According to other embodiments of the present invention, as shown in FIG. 5, the gap G can be filled with the sealant 120. In other words, the sealant 120 is disposed not only on the periphery of the organic emitting device layer 110 but also in the gap G between the passivation layer 112 and the circuit board 200. Thus, the adhesion between the circuit board 200 and the substrate 100 can be further strengthened and the external moisture and the oxygen can be further blocked from entering the organic emitting device layer 110.

Figure 6:
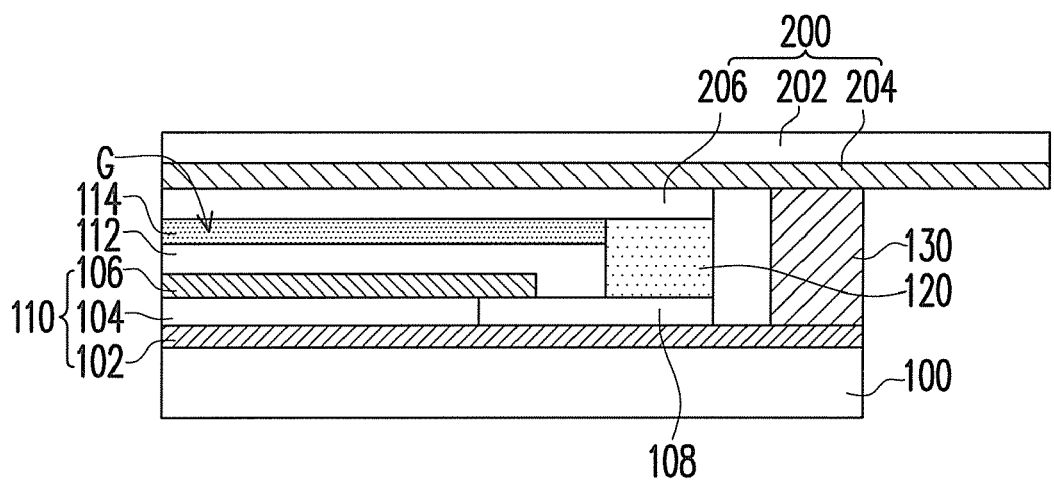

The embodiment shown in FIG. 5 illustrates that the gap G between the passivation layer 112 and the circuit board 200 is filled with the sealant 120. However, the present invention is not limited by the aforementioned configuration shown in FIG. 5. That is, in other embodiment, as shown in FIG. 6, the gap G between the passivation layer 112 and the circuit board 200 is filled with gel material 114 or gel can be UV cured or thermally cured to further block the external moisture and oxygen from entering the organic emitting device layer 110.

Figure 7:
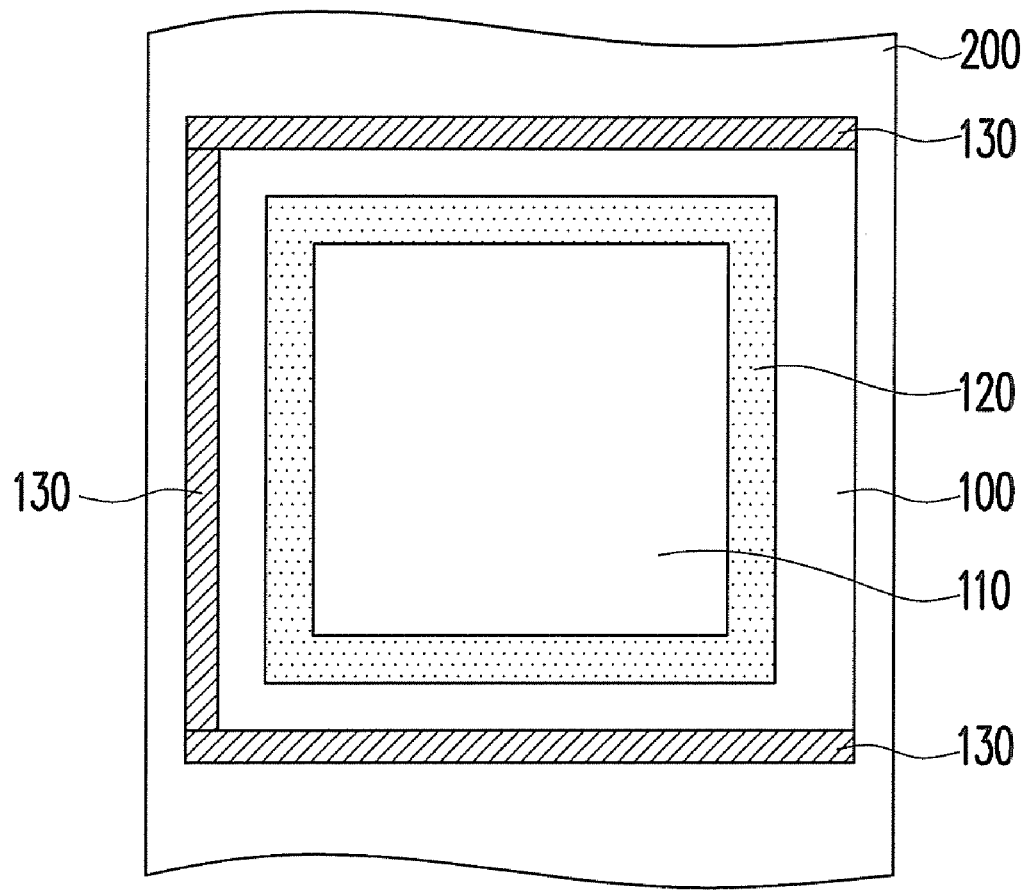
FIGS. 7 through FIG. 8 are schematic top views showing organic electroluminescence devices according to some embodiments of the invention.
Figure 8:
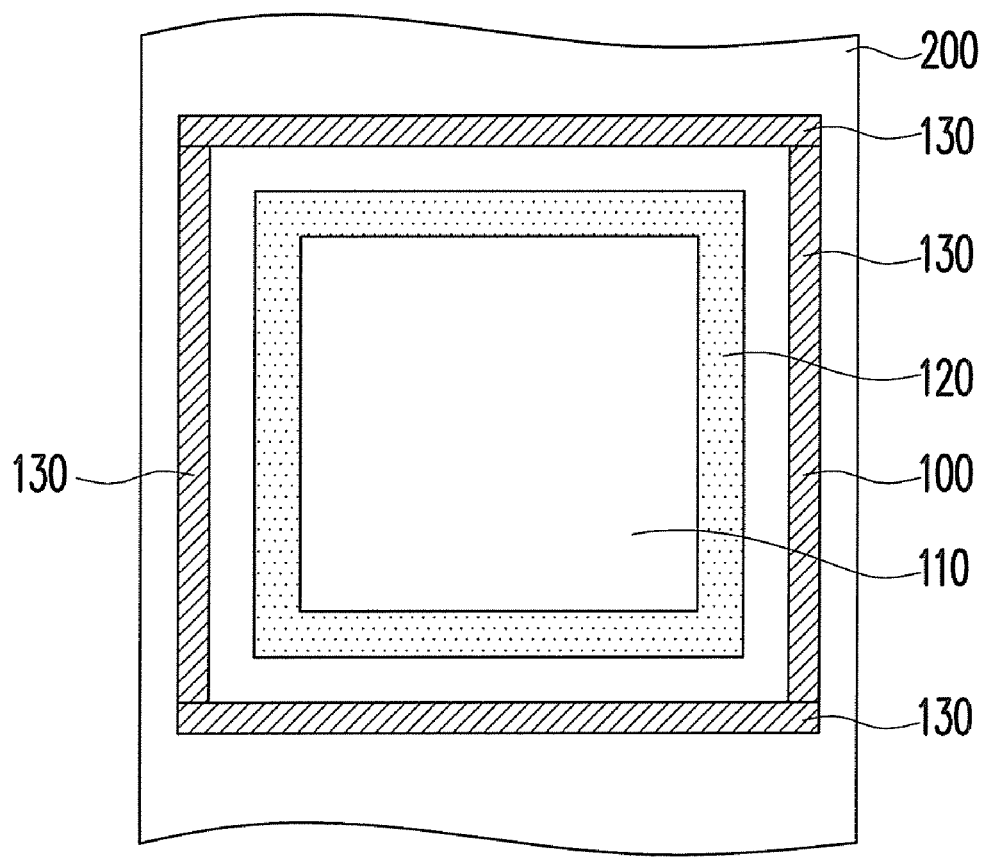

In the aforementioned embodiment shown in FIG. 1, the electrical bonding layer 130 is disposed at two opposite sides of the organic emitting device layer 110. However, the present invention is not limited by the aforementioned configuration shown in FIG. 1. That is, in other embodiments, the electrical bonding layer 130 can be formed on three of sides of the organic emitting device layer 110 (as shown in FIG. 7) or on the periphery of the organic emitting device layer 110 (as shown in FIG. 8). If the electrical bonding layer 130 is disposed on three sides of the organic emitting device layer 110, as shown in FIG. 7, the current signal on the circuit board 200 can be transmitted to the organic emitting device layer 110 through three sides of the organic emitting device layer 110 at the same time. Hence, the obvious voltage drop phenomenon of the organic emitting device layer 110 caused by the single input direction of the current signal can be alleviated. Therefore, the problem of poor light emitting uniformity due to the obvious voltage drop difference can be solved. Similarly, if the electrical bonding layer 130 is disposed on the periphery of the organic emitting device layer 110, as shown in FIG. 8, the current signal on the circuit board 200 can be transmitted to the organic emitting device layer 110 through the four sides of the organic emitting device layer 110 at the same time. Hence, the obvious voltage drop phenomenon of the organic emitting device layer 110 caused by the single input direction of the current signal can be alleviated. Therefore, the problem of poor light emitting uniformity due to the obvious voltage drop can be solved.

Figure 9:
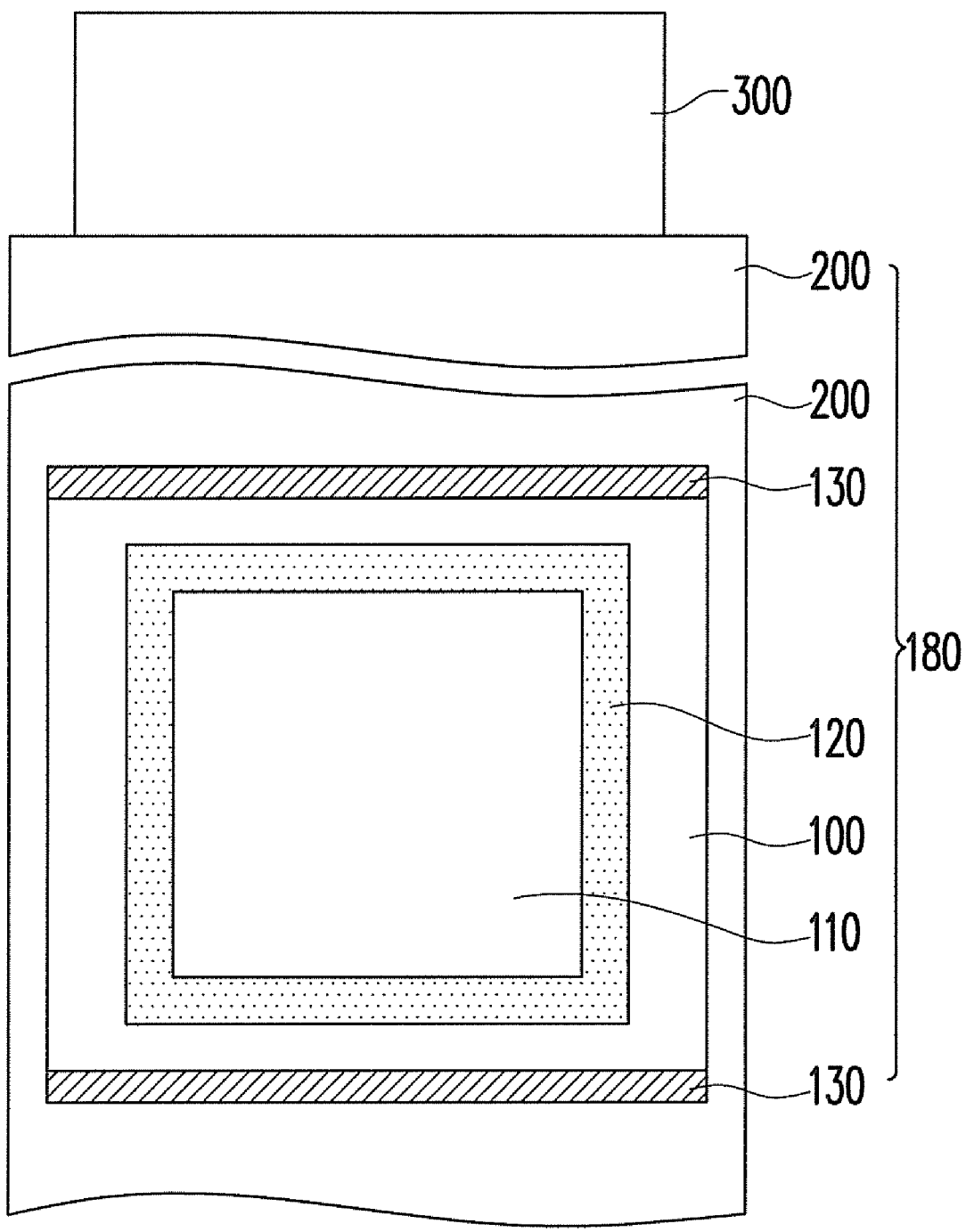
FIG. 9 is a schematic view of an electronic apparatus according to one embodiment of the present invention.

FIG. 9 is a schematic view of an electronic apparatus according to one embodiment of the present invention. As shown in FIG. 9, the electronic apparatus of the present embodiment includes an organic electroluminescence device 180 and a driving device 300. The organic electroluminescence device 180 can be one of the organic electroluminescence devices mentioned in the above embodiments shown in FIGS. 1 through 8. Also, the driving device 300 is electrically connected to the circuit board 200 of the organic electroluminescence device 180. The type of the driving devices 300 may differ according to the application of the product of the organic electroluminescence device 180. If the organic electroluminescence device 180 is used as a display, the driving device 300 electrically connected to the organic electroluminescence device 180 is a driving system used for driving the electroluminescence device 180 to display various images. If the organic electroluminescence device 180 is used as a luminescence device, the driving device 300 electrically connected to the organic electroluminescence device 180 is a driving system used for driving the electroluminescence device 180 to be turned on or turned off or the driving system for implementing other operations.

According to the above description, in the organic electroluminescence device of the present invention, the circuit board is directly disposed on the organic emitting device layer to protect the organic emitting device layer. That is, the circuit board can replace the conventional glass cover plate so that the cost of the glass cover plate and the time for assembling the glass cover plate can be saved.

Moreover, because the circuit board disposed on the substrate is electrically connected to the first electrode layer of the organic emitting device layer, the current signal on the circuit board can be transmitted to the first electrode layer. Particularly, according to the embodiment of the present invention, the current signal on the circuit board 200 can be transmitted into the organic emitting device layer 110 through both sides, three sides or the periphery of the organic emitting device layer. Therefore, the voltage drop difference between the region close to the power source end and the region away from the power source end can be avoided.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An organic electroluminescence device, comprising:
a substrate;
an organic emitting device layer disposed on the substrate, wherein the organic emitting device layer includes a first electrode layer, an emitting layer and a second electrode layer, and the first electrode layer is disposed on the substrate, the emitting layer is disposed on the first electrode layer and the second electrode layer is disposed on the emitting layer;
a circuit board disposed over the substrate and covering the organic emitting device layer;
a sealant disposed between the substrate and the circuit board to seal the circuit board on the substrate, wherein the first electrode layer extends to an outer peripheral region of the sealant; and
an electrical bonding layer disposed between the substrate and the circuit board to electrically connect the circuit board and the first electrode layer of the organic emitting device layer, wherein the electrical bonding layer is connected with the first electrode layer in the outer peripheral region of the sealant.

2. The organic electroluminescence device of claim 1, wherein the organic emitting device layer includes an active organic emitting device layer or a passive organic emitting device layer.

3. The organic electroluminescence device of claim 1, wherein the sealant is disposed on at least one side of the organic emitting device layer.

4. The organic electroluminescence device of claim 3, wherein the sealant is disposed on a periphery of the organic emitting device layer.

5. The organic electroluminescence device of claim 1, wherein the electrical bonding layer is disposed on at least two opposite sides of the organic emitting device layer.

6. The organic electroluminescence device of claim 5, wherein the electrical bonding layer is disposed on three sides of the organic emitting device layer or a periphery of the organic emitting device layer.

7. The organic electroluminescence device of claim 1, wherein the electrical bonding layer includes an anisotropic conductive paste layer.

8. The organic electroluminescence device of claim 1, further comprising a passivation layer covering the organic emitting device layer.

9. The organic electroluminescence device of claim 8, wherein there is a gap between circuit board and the passivation layer, and the sealant is further disposed in the gap.

10. The organic electroluminescence device of claim 8, wherein there is a gap between the circuit board and the passivation layer, and the gap is filled up with a gel material.

11. The organic electroluminescence device of claim 1, wherein the circuit board is a flexible circuit board.

12. The organic electroluminescence device of claim 1, wherein the electrical bonding layer is at the outer peripheral region of the sealant.

13. An electronic apparatus, comprising:
an organic electroluminescence device, comprising:
a substrate;
an organic emitting device layer disposed on the substrate, wherein the organic emitting device layer includes a first electrode layer, an emitting layer and a second electrode layer, and the first electrode layer is disposed on the substrate, the emitting layer is disposed on the first electrode layer and the second electrode layer is disposed on the emitting layer;
a circuit board disposed over the substrate and covering the organic emitting device layer;
a sealant disposed between the substrate and the circuit board to seal the circuit board on the substrate, wherein the first electrode layer extends to an outer peripheral region of the sealant;
an electrical bonding layer disposed between the substrate and the circuit board to electrically connect the circuit board and the first electrode layer of the organic emitting device layer, wherein the electrical bonding layer is connected with the first electrode layer in the outer peripheral region of the sealant; and
a driving device electrically connected to the circuit board of the organic electroluminescence device.

14. The electronic apparatus of claim 13, wherein the organic emitting device layer includes an active organic emitting device layer or a passive organic emitting device layer.

15. The electronic apparatus of claim 13, wherein the sealant is disposed on at least one side of the organic emitting device layer.

16. The electronic apparatus of claim 15, wherein the sealant is disposed on a periphery of the organic emitting device layer.

17. The electronic apparatus of claim 13, wherein the electrical bonding layer is disposed on at least two opposite sides of the organic emitting device layer.

18. The electronic apparatus of claim 17, wherein the electrical bonding layer is disposed on three sides of the organic emitting device layer or a periphery of the organic emitting device layer.

19. The electronic apparatus of claim 13, wherein the electrical bonding layer includes an anisotropic conductive paste layer.

20. The electronic apparatus of claim 13, further comprising a passivation layer covering the organic emitting device layer.

21. The electronic apparatus of claim 20, wherein there is a gap between circuit board and the passivation layer and the sealant is further disposed in the gap.

22. The electronic apparatus of claim 20, wherein there is a gap between the circuit board and the passivation layer and the gap is filled up with a gel material.

23. The electronic apparatus of claim 13, wherein the circuit board is a flexible circuit board.

24. The electronic apparatus of claim 13, wherein the electrical bonding layer is at the outer peripheral region of the sealant.

* * * * *